(12) United States Patent
Yang et al.

(10) Patent No.: US 7,678,288 B2
(45) Date of Patent: Mar. 16, 2010

(54) METHOD AND STRUCTURE FOR MANUFACTURING BONDED SUBSTRATES USING MULTIPLE PHOTOLITHOGRAPHY TOOLS

(75) Inventors: Xiao Yang, Cupertino, CA (US);
Kegang Huang, Fremont, CA (US);
Yuxiang Wang, Palo Alto, CA (US);
Howard Woo, San Jose, CA (US)

(73) Assignee: Miradia Inc., Santa Clara, CA (US)

( * ) Notice: Subject to any disclaimer, the term of this patent is extended or adjusted under 35 U.S.C. 154(b) by 1149 days.

(21) Appl. No.: 11/004,588

(22) Filed: Dec. 3, 2004

(65) Prior Publication Data
US 2006/0121373 A1    Jun. 8, 2006

(51) Int. Cl.
*H01L 21/302* (2006.01)

(52) U.S. Cl. .............................. 216/33; 216/59; 216/84; 438/14; 438/401; 438/455; 438/456; 438/459; 356/401

(58) Field of Classification Search .................... 216/59, 216/84
See application file for complete search history.

(56) References Cited

U.S. PATENT DOCUMENTS

| | | | | |
|---|---|---|---|---|
| 5,695,897 A | * | 12/1997 | Mitome et al. | 430/22 |
| 5,800,949 A | * | 9/1998 | Edo et al. | 430/5 |
| 5,948,572 A | * | 9/1999 | Liu et al. | 430/5 |
| 6,190,807 B1 | * | 2/2001 | Wang et al. | 430/5 |
| 6,258,611 B1 | * | 7/2001 | Leroux | 438/14 |
| 6,822,326 B2 | | 11/2004 | Enquist et al. | |
| 7,054,007 B2 | * | 5/2006 | Leroux et al. | 356/401 |
| 2002/0064715 A1 | * | 5/2002 | Nam et al. | 430/5 |
| 2004/0158423 A1 | * | 8/2004 | Laursen et al. | 702/109 |
| 2004/0162687 A1 | * | 8/2004 | Smith et al. | 702/85 |

* cited by examiner

*Primary Examiner*—Anita K Alanko
(74) *Attorney, Agent, or Firm*—Townsend and Townsend and Crew LLP

(57) ABSTRACT

A method of manufacturing bonded substrate structures. The method includes providing a first substrate comprising a first surface region and processing the first surface region to form a first pattern region using a first photolithographic stepper characterized by a first tolerance criteria for alignment. The method also includes providing a second substrate comprising a second surface region and processing the second surface region through at least one masking process to form a second pattern region using a second photolithographic stepper characterized by a second tolerance criteria for alignment. Further, the method includes determining a masking process having a third tolerance criteria for alignment, the third tolerance criteria allowing for a change from the second to the first photographic stepper, processing the second substrate for at least the determined masking process using the first photolithographic stepper, and joining the first substrate to the second substrate to form a composite substrate structure.

18 Claims, 11 Drawing Sheets

METHOD AND STRUCTURE FOR MANUFACTURING BONDED SUBSTRATES USING MULTIPLE PHOTOLITHOGRAPHY TOOLS

BACKGROUND OF THE INVENTION

This present invention relates generally to manufacturing objects. More particularly, the invention relates to a method and structure for manufacturing bonded substrates using multiple photolithography tools. Merely by way of example, the invention has been applied to the processing of a number of substrates using different photolithographic steppers characterized by different tolerance criteria for alignment and the subsequent joining of the substrates to form a composite substrate structure. The method and structure can be applied to semiconductor devices as well as other composite structures, for example, glass substrates for display applications and sensors.

The manufacturing of a variety of micro-electromechanical systems (MEMS) and micro-electromechanical devices utilizes wafer bonding. In some MEMS, including accelerometers and micro-mirrors, a sealed microcavity is used to protect the device from exposure to outside environments, while allowing the MEMS to perform the desired mechanical functions. In other MEMS application, a vacuum-sealed package is formed by wafer bonding of substrates, followed by subsequent packaging processes.

Wafer bonding techniques commonly employ a process for joining two substrates. In some cases, the substrates that are joined together are made of dissimilar materials or have been processed using different processing techniques. In particular, for some MEMS applications, silicon substrates fabricated using a first processing sequence performed using a first photolithography tool or stepper are bonded to glass substrates fabricated using a second processing sequence performed on a second photolithography tool. When different photolithographic steppers are used in the fabrication process for different substrates, it is possible that misalignment of the substrates can result, producing device failures at locations where elements on the first substrate (in some cases a silicon substrate) are misaligned with respect to elements on the second substrate (in some cases a glass substrate).

From the above, there is a need in the art for improved methods and structures for the manufacturing of bonded substrates using multiple photolithography tools.

SUMMARY OF THE INVENTION

According to the present invention, techniques for manufacturing objects are provided. More particularly, the invention provides a method and structure for manufacturing bonded substrates using multiple photolithography tools. Merely by way of example, the invention has been applied to the processing of a number of substrates using different photolithographic steppers characterized by different tolerance criteria for alignment and the subsequent joining of the substrates to form a composite substrate structure. The method and structure can be applied to semiconductor devices as well as other composite structures, for example, glass substrates for display applications and sensors.

In a specific embodiment according to the present invention, a method of manufacturing bonded substrate structures is provided. The method comprises providing a first substrate comprising a first surface region and processing the first surface region of the first substrate to form a first pattern region using a first photolithographic stepper characterized by a first tolerance criteria for alignment. The method also comprises providing a second substrate comprising a second surface region and processing the second surface region of the second substrate through at least one masking process to form a second pattern region using a second photolithographic stepper characterized by a second tolerance criteria for alignment. Further, the method comprises determining a masking process having a third tolerance criteria for alignment, the third tolerance criteria allowing for a change from the second photographic stepper to the first photographic stepper, processing the second substrate for at least the determined masking process using the first photolithographic stepper, and joining the first substrate to the second substrate to form a composite substrate structure.

In another embodiment according to the present invention, another method of manufacturing bonded substrate structures is provided. The method comprises providing a first substrate comprising a first surface region and using a first set of alignment marks to process the first surface region of the first substrate to form a first pattern region utilizing a first photolithographic stepper characterized by a first tolerance criteria for alignment. The method also includes providing a second substrate comprising a second surface region and using a second set of alignment marks to process the second surface region of the second substrate through at least one masking process to form a second pattern region using a second photolithographic stepper characterized by a second tolerance criteria for alignment. Further, the method includes determining a masking process having a third tolerance criteria for alignment, the third tolerance criteria allowing for a change from the second photographic stepper to the first photographic stepper, forming a third set of alignment marks on the second substrate using the second photolithographic stepper, processing the second substrate for at least the determined masking process using the first photolithographic stepper, and joining the first substrate to the second substrate to form a composite substrate structure.

In one specific embodiment of the present invention, a method of manufacturing bonded substrate structures is provided. The method comprises providing a first substrate comprising a first surface region and processing the first surface region of the first substrate through at least one masking step to form a first pattern region using a first photolithographic stepper. The method further includes providing a second substrate comprising a second surface region and processing the second surface region of the second substrate through at least one masking step to form a second pattern region using a second photolithographic stepper. Moreover, the method comprises processing the second surface region of the second substrate through at least one masking step to form a third pattern region using the first photolithographic stepper and bonding the first substrate to the second substrate to form a composite substrate structure.

In another specific embodiment of the present invention, a system for manufacturing bonded substrate structures is provided. The system includes a first photolithographic stepper apparatus comprising a first support member adapted to receive a first substrate comprising a first surface region, a first light source adapted to illuminate a first surface region of the first substrate to form a first pattern on the first surface region, the first support member adapted to receive a second substrate comprising a second surface region, and the first light source adapted to illuminate a second surface region of the second substrate to form a second pattern on the second surface region. The system further includes a second photolithographic stepper apparatus comprising a second support member adapted to receive the second substrate and a second light source adapted to illuminate the second surface region of the second substrate to form a third pattern on the second surface region. The system also includes a bonding apparatus adapted to join the first substrate and the second substrate to form a composite substrate structure.

In an alternative embodiment according to the present invention, yet another method of manufacturing bonded substrate structures is provided. The method comprises providing a first substrate comprising a first surface region and processing the first surface region of the first substrate to form a first pattern region using a first photolithographic stepper characterized by a first tolerance criteria for alignment. The method also includes providing a second substrate comprising a second surface region, defining a first set of alignment marks on the second surface region using the first photolithographic stepper, and defining a second set of alignment marks on the second surface region using a second photolithographic stepper characterized by a second tolerance criteria for alignment, wherein the second set of alignment marks are referenced to the first set of alignment marks. Further, the method includes processing the second surface region of the second substrate through at least one masking process to form a second pattern region using the second photolithographic stepper and determining a masking process having a third tolerance criteria for alignment, the third tolerance criteria allowing for a change from the second photolithographic stepper to the first photolithographic stepper. In addition, the method includes processing the second substrate through at least the determined masking process using the first photolithographic stepper and joining the first substrate to the second substrate to form a composite substrate structure.

In yet another alternative embodiment of the present invention, another method of manufacturing bonded substrate structures is provided. The method includes providing a first substrate comprising a first surface region, processing the first surface region of the first substrate to form a first pattern region using a first photolithographic stepper characterized by a first tolerance criteria for alignment, and processing the first surface region of the first substrate to form a first set of bonding alignment marks on the first surface region using the first photolithographic stepper. The method also includes providing a second substrate comprising a second surface region, defining a first set of alignment marks on the second surface region using the first photolithographic stepper, and defining a second set of alignment marks on the second surface region using a second photolithographic stepper characterized by a second tolerance criteria for alignment, wherein the second set of alignment marks are referenced to the first set of alignment marks. Additionally, the method includes processing the second surface region of the second substrate to form a second pattern region using the second photolithographic stepper, processing the second surface region of the second substrate to form a second set of bonding alignment marks on the second surface region using the second photolithographic stepper, and joining the first substrate to the second substrate to form a composite substrate structure.

Many benefits are achieved by way of the present invention over conventional techniques. For example, the present technique provides an easy to use process that relies upon conventional technology. In some embodiments, the method provides higher device yields. Additionally, the method provides a process that is compatible with conventional process technology without substantial modifications to conventional equipment and processes. Depending upon the embodiment, one or more of these benefits may be achieved. These and other benefits will be described in more detail throughout the present specification and more particularly below.

These and other objects and features of the present invention and the manner of obtaining them will become apparent to those skilled in the art, and the invention itself will be best understood by reference to the following detailed description read in conjunction with the accompanying drawings.

DESCRIPTION OF SPECIFIC EMBODIMENTS

According to the present invention, techniques for manufacturing objects are provided. More particularly, the invention provides a method and structure for manufacturing bonded substrates using multiple photolithography tools. Merely by way of example, the invention has been applied to the processing of a number of substrates using different photolithographic steppers characterized by different tolerance criteria for alignment and the subsequent joining of the substrates to form a composite substrate structure. The method and structure can be applied to semiconductor devices as well as other composite structures, for example, glass substrates for display applications and sensors.

Figure 1A:
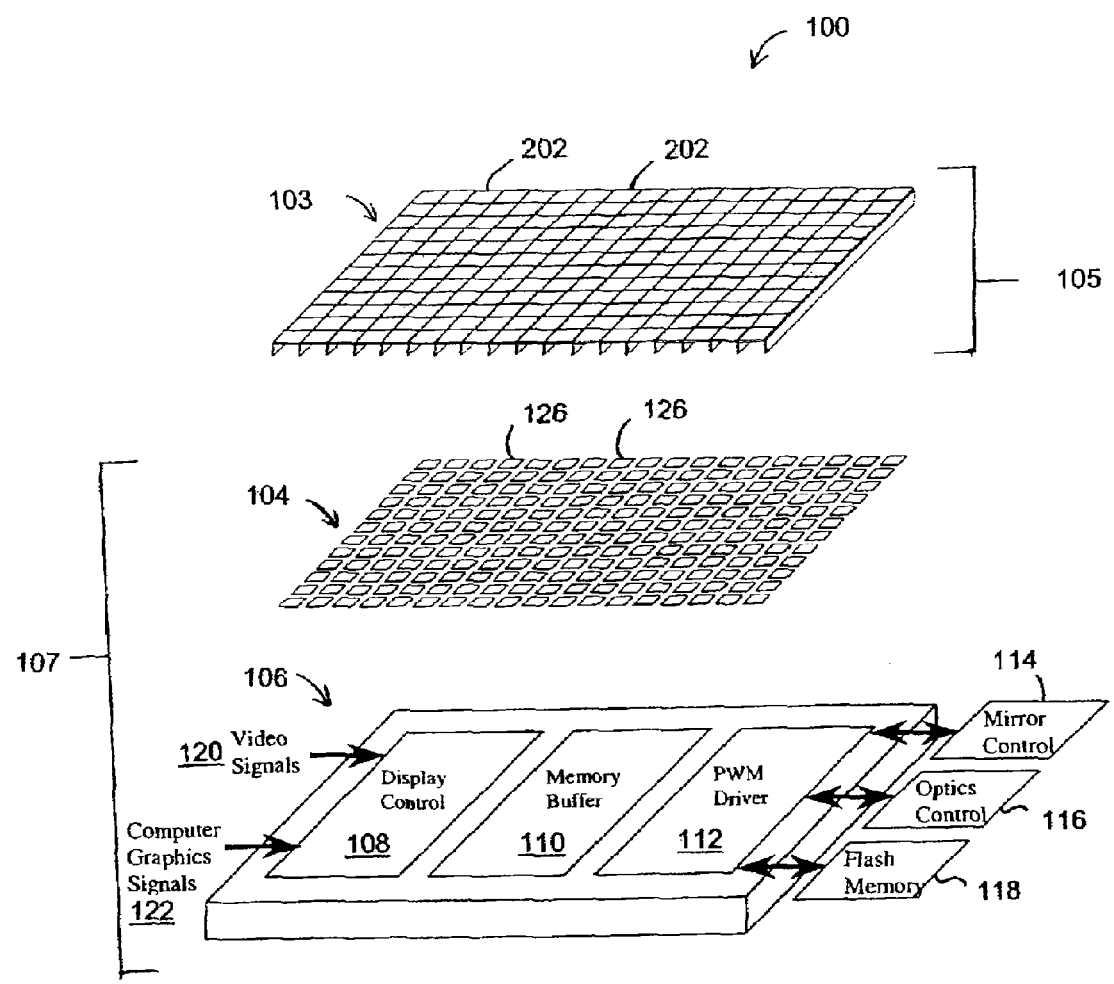
FIG. 1A is a diagram that illustrates the general architecture of a spatial light modulator according to one embodiment of the invention.

FIG. 1A is a diagram that illustrates the general architecture of a spatial light modulator (SLM) 100 according to one embodiment of the invention. The illustrated embodiment has three layers. The first layer is a mirror array 103 that has a plurality of deflectable micro-mirrors 202. In one preferred embodiment, the micro-mirror array 103 is fabricated from a first substrate 105 that is a single material, such as single crystal silicon. An example of one way of forming this SLM is described in U.S. patent application Ser. No. 10/378,056, filed Feb. 27, 2003 now U.S. Patent Publication No. 2003/0234994 A1, published on Dec. 25, 2003, commonly owned, and hereby incorporated by reference for all purposes.

The second layer is an electrode array 104 with a plurality of electrodes 126 for controlling the micro-mirrors 202. Each electrode 126 is associated with a micro-mirror 202 and controls the deflection of that micro-mirror 202. Addressing circuitry allows selection of a single electrode 126 for control of the particular micro-mirror 202 associated with that electrode 126.

The third layer is a layer of control circuitry 106. This control circuitry 106 has addressing circuitry, which allows the control circuitry 106 to control a voltage applied to selected electrodes 126. This allows the control circuitry 106 to control the deflections of the mirrors 202 in the mirror array 103 via the electrodes 126. Typically, the control circuitry 106 also includes a display control 108, line memory buffers 110, a pulse width modulation array 112, and inputs for video signals 120 and graphics signals 122. A microcontroller 114, optics control circuitry 116, and a flash memory 118 may be external components connected to the control circuitry 106, or may be included in the control circuitry 106 in some embodiments. In various embodiments, some of the above listed parts of the control circuitry 106 may be absent, may be on a separate substrate and connected to the control circuitry 106, or other additional components may be present as part of the control circuitry 106 or connected to the control circuitry 106.

In one embodiment, both the second layer 104 and the third layer 106 are fabricated using semiconductor fabrication technology on a single second substrate 107. That is, the second layer 104 is not necessarily separate and above the third layer 106. Rather, the term "layer" is an aid for conceptualizing different parts of the spatial light modulator 100. For example, in one embodiment, both the second layer 104 of electrodes is fabricated on top of the third layer of control circuitry 106, both fabricated on a single second substrate 107. That is, the electrodes 126, as well as the display control 108, line memory buffers 110, and the pulse width modulation array 112 are all fabricated on a single substrate in one embodiment. Integration of several functional components of the control circuitry 106 on the same substrate provides an advantage of improved data transfer rate over conventional spatial light modulators, which have the display control 108, line memory buffers 110, and the pulse width modulation array 112 fabricated on a separate substrate. Further, fabricating the second layer of the electrode array 104 and the third layer of the control circuitry 106 on a single substrate 107 provides the advantage of simple and cheap fabrication, and a compact final product. After the layers 103, 104, and 106 are fabricated, they are bonded together to form the SLM 100.

Figure 1B:
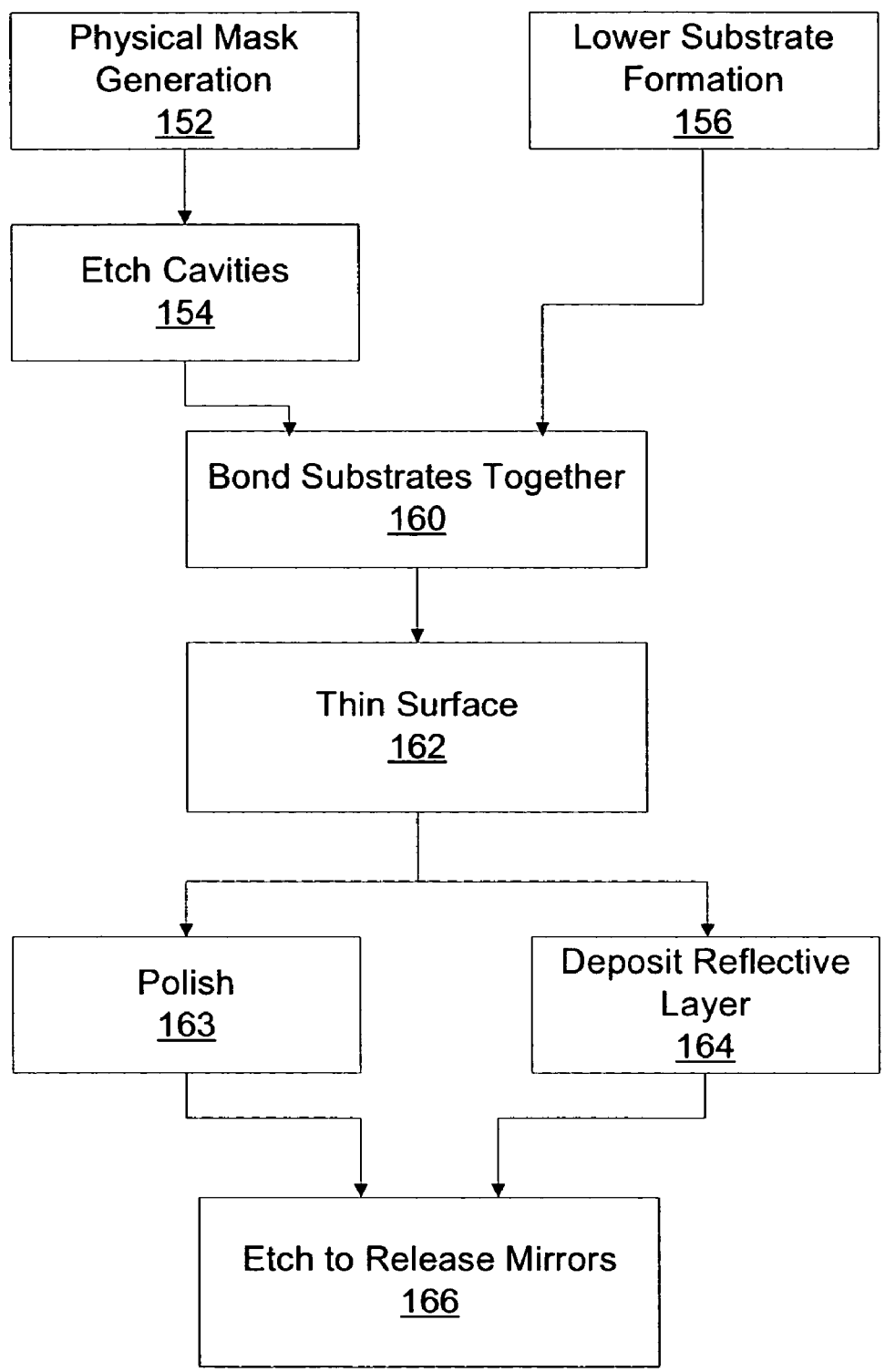
FIG. 1B is a flowchart illustrating a preferred embodiment of how the spatial light modulator is fabricated.

FIG. 1B is a flowchart illustrating one preferred embodiment of how the spatial light modulator 100 is fabricated. A first mask is generated 152 to initially partially fabricate the micro-mirrors 202 on first substrate 105. Standard techniques, such as photolithography, can be used to generate the mask on the first substrate. As mentioned previously, in one preferred embodiment the micro-mirrors 202 are formed from a single material, such as single crystal silicon. Thus, in one preferred embodiment, the first substrate 105 is a wafer of single crystal silicon. Note that typically multiple micro-mirror arrays 103, to be used in multiple SLMs 100, are fabricated on a single wafer, to be separated later. The structures fabricated to create the micro-mirror array 103 are typically larger than the features used in CMOS circuitry, so it is relatively easy to form the micro-mirror array 103 structures using known techniques for fabricating CMOS circuitry.

After the mask is generated 152, in a preferred embodiment, the first substrate 105 is anisotropically ion etched 154 to form the cavities beneath the mirror plates. Put in another way, a "well" is formed in the first substrate for every micro-mirror 202. Other methods besides an anisotropic ion etch may also be used to form the cavities or "wells," such as a wet etch or a plasma etch.

Separately from the fabrication of the cavities beneath the mirror plates, the electrodes 126 and control circuitry 106 are fabricated 156 on the second substrate 107. The second substrate 107 may be a transparent material, such as quartz, or another material. If the second substrate is quartz, transistors may be made from polysilicon, as compared to crystalline silicon. The circuitry can be fabricated 156 using standard CMOS fabrication technology. For example, in one embodiment, the control circuitry 106 fabricated 156 on the second substrate 107 includes an array of memory cells, row address circuitry, and column data loading circuitry. There are many different methods to make electrical circuitry that performs the addressing function. The DRAM, SRAM, and latch devices commonly known may all perform the addressing function. Since the mirror plate area may be relatively large on semiconductor scales (for example, the mirror plate may have an area of 225 $\mu m^2$), complex circuitry can be manufactured beneath micro-mirror 202. Possible circuitry includes, but is not limited to, storage buffers to store time sequential pixel information, circuitry to compensate for possible non-uniformity of mirror plate to electrode 126 separation distances by driving the electrodes 126 at varying voltage levels, and circuitry to perform pulse width modulation conversions. In alternative embodiments, the second substrate 107 is a silicon wafer and the circuitry is fabricated using standard CMOS fabrication technology.

In one embodiment, this control circuitry 106 is covered with a passivation layer such as silicon oxide or silicon nitride. Next, a metallization layer is deposited. This metallization layer is patterned and etched to define electrodes 126, as well as a bias/reset bus in one embodiment. The electrodes 126 are placed during fabrication so that one or more of the electrodes 126 corresponds to each micro-mirror 202. As with the first substrate 105, typically multiple sets of circuitry to be used in multiple SLMs 100 are fabricated 156 on the second substrate 107 to be separated later.

Next, the first and second substrates are bonded 160 together. The side of the first substrate 105 that has the cavities is bonded to the side of the second substrate 107 that has the electrodes. The substrates 105 and 107 are aligned so that the electrodes on the second substrate 107 are in the proper position to control the deflection of the micro-mirrors 202 in the micro-mirror array 103. In one embodiment, the two substrates 105 and 107 are optically aligned using double focusing microscopes by aligning a pattern on the first substrate 105 with a pattern on the second substrate 107, and the two substrates 105 and 107 are bonded together by low temperature bonding methods such as anodic or eutectic bonding. There are many possible alternate embodiments to the fabrication 160. For example, thermoplastics or dielectric spin glass bonding materials can be used; so that the substrates 105 and 107 are bonded thermal-mechanically.

After bonding the first and second substrates 105 and 107 together, the surface of the first substrate 105 that has not been etched is thinned 162 to a desired thickness. This thinning is done in one embodiment by mechanically grinding the substrate 105 to a thickness between the bottom of the fabricated "well" and the opposing surface of the first substrate 105 that is near the desired thickness of the micro-mirror 202. In one embodiment, this thickness achieved by mechanical grinding is approximately 5 μm. The substrate 105 is then polished by mechanical fine polishing or chemical mechanical polishing to the thickness desired between the bottom of the "well" and the opposing surface of the first substrate 105. This thickness defines the thickness of the mirror plates. In one embodiment, this desired thickness is less than approximately 1 µm or less.

Next, the reflective surface of the micro-mirror 202 is created. This can be done through polishing 163 the first substrate 105 so that the surface of the first substrate 105 is reflective. It is also possible to deposit 164 a layer of a reflective material on the first substrate 105 to create a reflective surface. Other methods to create a reflective surface may also be used.

In one embodiment, a reflective layer of aluminum is deposited 164. The thinned surface of the first substrate 105 is coated with approximately 10 nm of titanium seed thin film. Then an approximately 30 nm thick layer of aluminum is deposited to form a reflective layer with a reflectivity above 95% over much of the visible optical spectrum.

The reflective surface of the first substrate 105 is then masked and, in a preferred embodiment, high-aspect-ratio anisotropically ion etched 166 to finish forming the micromirror array 103 and release the mirror plates. This second etch defines micro-mirror array features including the mirror plate, a torsion spring hinge, and a connector between the mirror plate and the hinge. Thus, it only takes two etchings of the first substrate 105 to fabricate the micro-mirrors 202. This significantly decreases the cost of fabricating the micro-mirrors 202.

Figure 2:
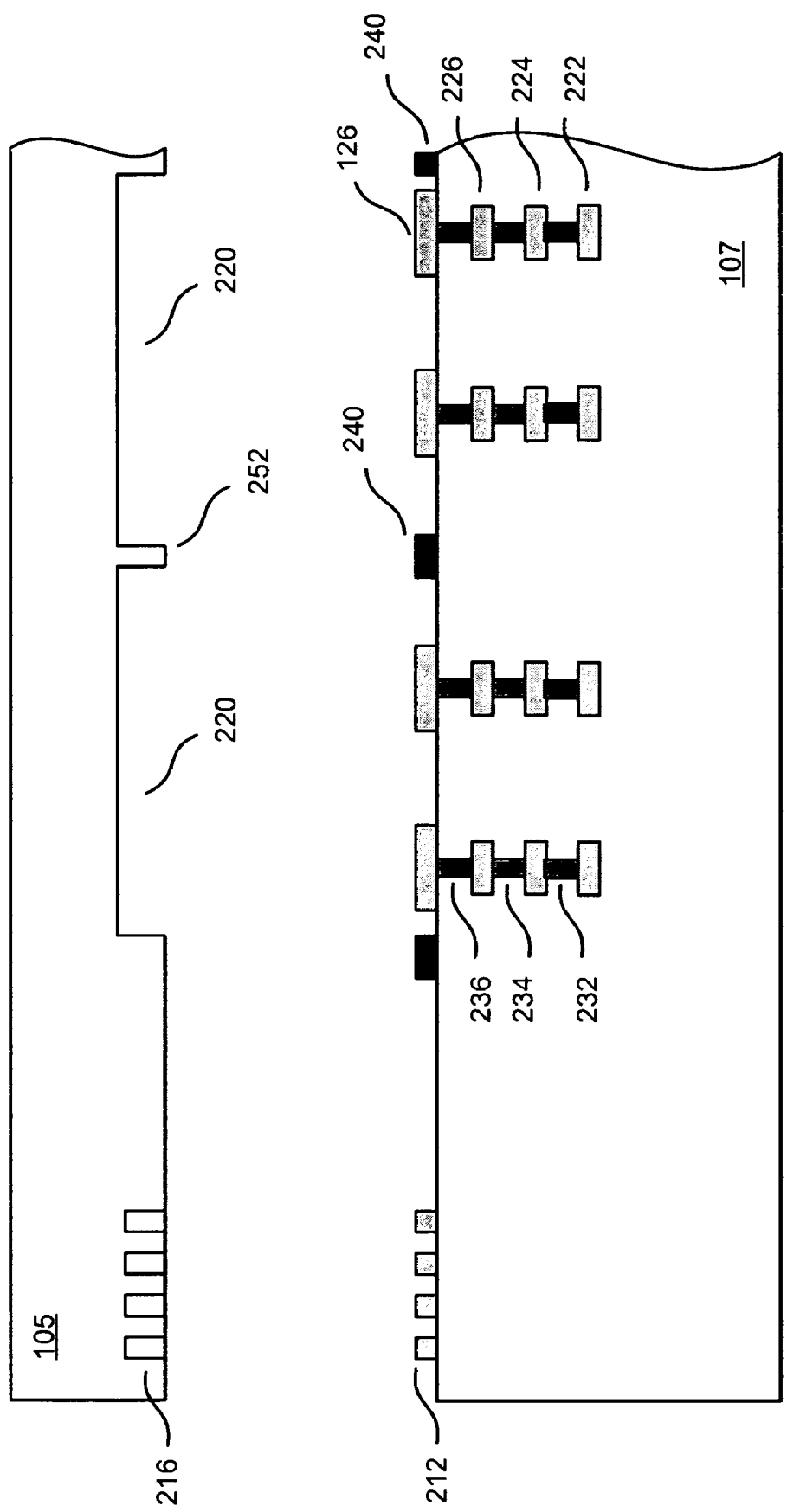
FIG. 2 is a simplified schematic illustration of two substrates prior to a wafer bonding process according to an embodiment of the present invention.

FIG. 2 is a simplified schematic illustration of two substrates prior to a wafer bonding process according to an embodiment of the present invention. This diagram is merely an example, which should not unduly limit the scope of the claims herein. One of ordinary skill in the art would recognize many variations, modifications, and alternatives. As illustrated in FIG. 2 and discussed previously, substrate 105 and 107 are processed using semiconductor processing techniques to form features on a first substrate 105 including a mirror array and on a second substrate 107 including both control circuitry and an electrode array.

In one embodiment, substrate 107 is formed using a 2 poly/4 metal process, in which four metal layers; 222, 224, 226, and 126 are connected using three via layers; 232, 234, and 236, respectively. Metal layer 126 forms the electrode structure as described above. Bonding alignment marks 212 and 216 are provided on substrates 107 and 105, respectively, to aid in alignment of the substrates during the substrate bonding process. Bonding alignment marks 216 are typically defined on the surface of substrate 105 using the same mask layout used to define the "wells" or recessed regions 220. Bonding alignment marks 212 are typically defined on the surface of substrate 107 using the same mask layout used to define the metal 4 layer used in defining electrodes 126. One of ordinary skill in the art would recognize many variations, modifications, and alternatives. In particular, the bonding alignment marks 212 and 216 are used to align the spacer walls 252 on substrate 105 to the oxide bond pads 240 on substrate 107 during the substrate bonding process. The alignment of the spacer walls 252 to the oxide bond pads 240 provides for proper alignment of the electrodes 126 to the mirrors (formed above the wells or recessed regions 220 on substrate 105 in later steps as described above). In some embodiments of the present invention, the tolerance for the alignment between the spacer walls 252 on substrate 105 and the oxide bond pads 240 on substrate 107 is about 0.2 µm.

Although the above description of the present invention has been described in terms of certain embodiments (e.g., the 2 poly/4 metal process), it would be appreciated that the invention can have variations, modifications, and alternatives. As merely an example, alternative embodiments utilize modified electrode structures containing additional or fewer metal and via layers. Moreover, although definition of certain bonding alignment marks and is performed in some embodiments using the same mask layout as other layers, this is not required by the present invention. The bonding alignment marks may be defined using separate mask layouts from other layers and may be defined prior to, simultaneously with, or subsequent to the definition of such other layers, depending on the particular application. Of course, there can be other variations, modifications, and alternatives.

In performing the aforementioned processing steps, photolithography tools are utilized to expose patterns, such as those associated with the electrodes and mirrors, on the surface of the semiconductor substrates. These patterns are subsequently developed to form a variety of features on the substrate surface. Photolithography tools, often referred to as photolithographic steppers or simply steppers, are designed and manufactured to provide high levels of accuracy with respect to spatial tolerances. These tools typically operate as step and repeat tools, exposing a first portion of the substrate, referred to as a die, moving to a new position on the substrate, and repeating the process for subsequent dies until the entire substrate has been exposed. The surface of the substrate exposed to radiation from the stepper is covered with a light-sensitive material (photoresist) that is subsequently developed to produce a pre-determined pattern on the substrate surface.

Figure 3A:
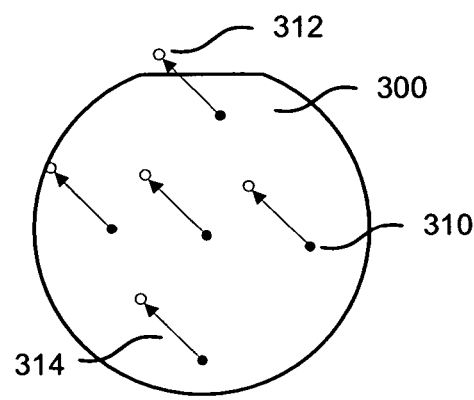
FIGS. 3A-3C are simplified schematic illustrations of possible forms of stepper misalignment.
Figure 3B:
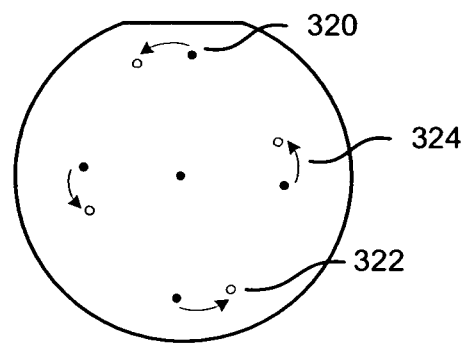
Figure 3C:
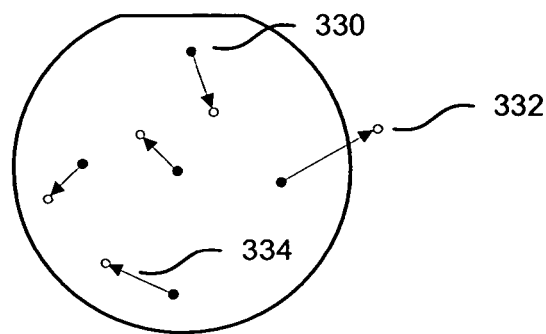

In some photolithographic steppers, the alignment accuracy is impacted by various optical and mechanical errors. For example, FIGS. 3A-3C are simplified schematic illustrations of possible forms of stepper misalignment according to an embodiment of the present invention. The forms of stepper misalignment illustrated in FIGS. 3A and 3B are commonly referred to as translation and rotation error, respectively. The form of stepper misalignment illustrated in FIG. 3C is commonly referred to as distortion.

As illustrated in FIG. 3A, a substrate 300 is exposed using a stepper with patterns positioned at desired locations 310. Due to translation errors in the stepper, the actual locations 312 of the exposed patterns can be shifted by a given distance 314 with respect to the desired locations 310. As a result, features fabricated on the substrate, rather than being located at desired locations 310 are shifted in the plane of the substrate by approximately the distance 314 and are located at actual positions 312. Similarly, as illustrated in FIG. 3B, rotation errors in the stepper can result in a rotational shifting of the exposed patterns from desired locations 320 to actual locations 322. As illustrated in FIG. 3B, each of the patterns are shifted by a distance measured along the arc 324. For both the translational error illustrated in FIG. 3A and the rotational error illustrated in FIG. 3B, alignment issues for any given substrate are not typically compromised by these errors. Because steppers typically utilize a step and repeat process, as discussed above, each die exposed by the stepper is translated by the same distance 314 or 324, as illustrated in FIGS. 3A and 3B. For some processes, this misalignment is not problematic, only resulting in an overall shift of the exposed patterns. However, in processes utilizing more than one photolithography tool, if each tool is characterized by unique translation and rotation errors, misalignment of dies can result, producing misalignment between features.

FIG. 3C is a simplified schematic illustrations of a third possible form of stepper misalignment according to an embodiment of the present invention. Distortion in the image formed by the stepper can result in patterns at desired locations 330 shifting to actual locations 332. In some cases, each of the desired locations is shifted by a different distance and direction 334. Because distortion in the image plane can lead to device failure, it is common for makers of photolithography tools to take significant steps to reduce distortion.

In some fabrication processes, different steppers are utilized in fabricating the structures present on substrates 105 and 107. The use of different steppers may result from several design criteria, including available resolution, wafer throughput, and cost, among other factors. For example, one process flow utilizes a first stepper with 0.18 µm resolution made by ASML Netherlands B. V., of Veldhoven, The Netherlands in the fabrication of substrate 105. Another process flow utilizes a second stepper with 0.35 µm resolution made by Canon, Inc. of Tokyo, Japan in the fabrication of substrate 107. As a result of utilizing these different steppers, a stepper mismatch of approximately 0.33 µm results in this exemplary process flow. This level of stepper mismatch is unsuitable for the fabrication of some SLMs as described in some of the embodiments above, in which the final tolerance for alignment is approximately 0.2 µm.

Figure 4:
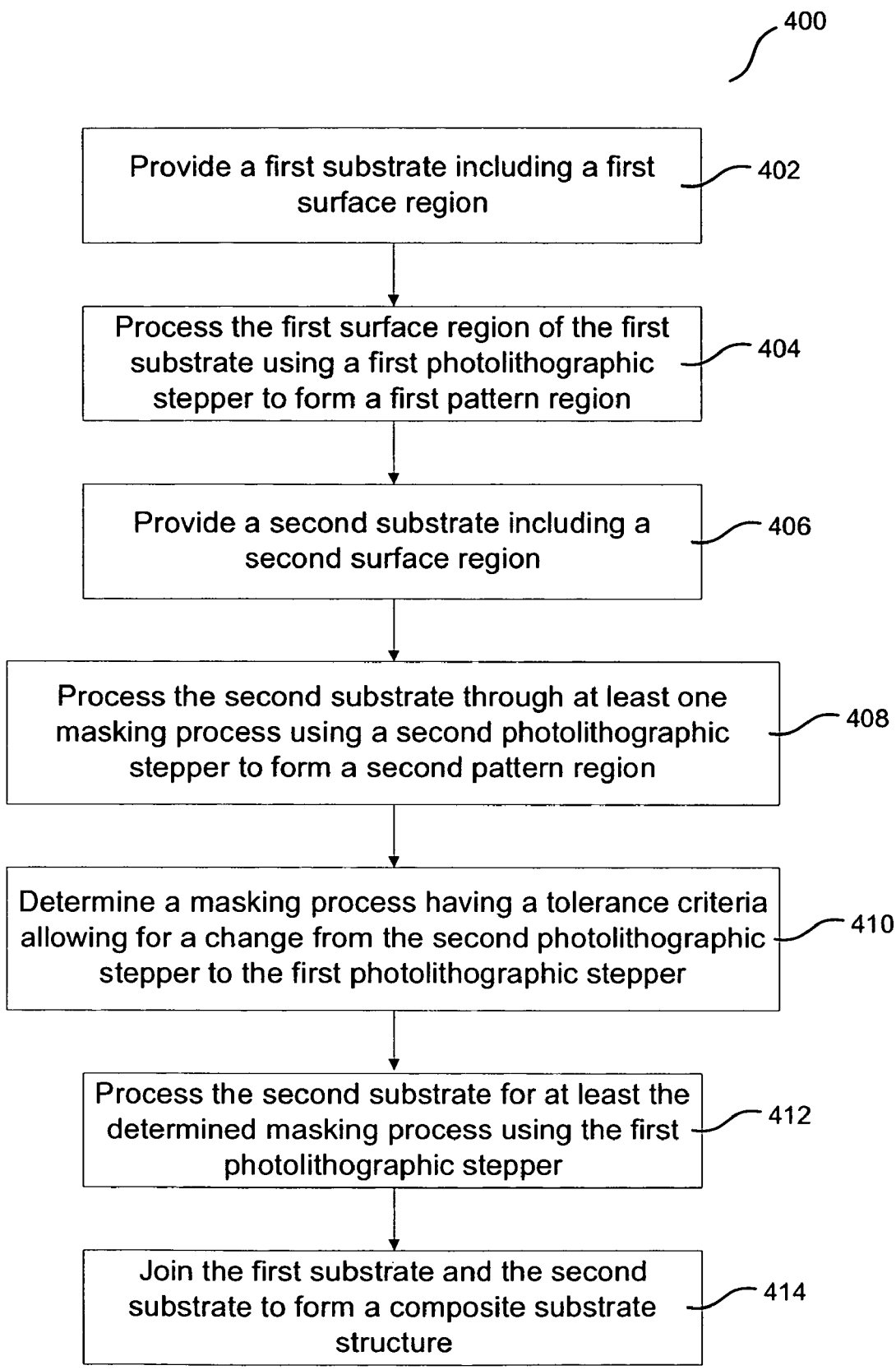
FIG. 4 is a simplified flow chart of a substrate bonding process according to an embodiment of the present invention.

FIG. 4 is a simplified flow chart of a substrate bonding process 400 according to an embodiment of the present invention. In step 402, a first substrate is provided including a first surface region. In one embodiment, the first substrate is a silicon substrate, but this is not required by the present invention. The first surface region of the first substrate is processed (404) using a first photolithographic stepper to form a first pattern region, for example, an array of recessed cavities or wells suitable for the subsequent formation of an array of micro-mirrors. The first pattern region includes additional device features in some embodiments, for example, a first set of bonding alignment marks 216 as illustrated in FIG. 2. In some embodiments, the stepper utilizes a step and repeat process to expose die patterns over an extended area of the first substrate. As discussed above, in one embodiment, the first stepper is characterized by an optical resolution and one or more alignment errors, including, but not limited to, translation, rotation, and distortion. In a particular embodiment according to the present invention, the first photolithographic stepper has a resolution of about 0.18 µm. Alignment marks are provided on the first substrate to guide the alignment process of the first stepper. Additional discussion of the alignment marks is provided below in relation to FIG. 5.

In step 406, a second substrate is provided including a second surface region. The second substrate is processed in step 408 through at least one masking process using a second photolithographic stepper to form a second pattern region. In a specific embodiment, the second substrate is processed to form control circuitry and an array of electrodes coupled to the control circuitry. In step 410, a determination is made of a masking process having a tolerance criteria allowing for a change from the second photolithographic stepper to the first photolithographic stepper. In some embodiments, a tolerance criteria allowing for a change in steppers is an alignment tolerance for a particular structural feature, but this is not required by the present invention. In other embodiments, the tolerance criteria is an alignment tolerance for layer to layer alignment on a particular substrate.

In step 412, the second substrate is processed for at least the determined masking process using the first photolithographic stepper. In a specific embodiment, the first photolithographic stepper is used to define a second set of bonding alignment marks 212 as illustrated in FIG. 2. The first and second substrates are joined in step 414 to form a composite substrate structure. The first and second set of bonding alignment marks are used in aligning the substrates during the joining process in some embodiments. Because the first and second set of bonding alignment marks are defined using the same photolithographic stepper in this embodiment of the present invention, the impact of stepper mismatch is reduced.

It should be appreciated that the specific steps illustrated in FIG. 4 provide a particular process flow according to one embodiment of the present invention. Other sequence of steps may also be performed according to alternative embodiments. For example, alternative embodiments of the present invention may perform the processing steps outlined above in a different order. For example, the order in which the substrates are processed may be varied, with the second substrate being processed prior to the first substrate. Moreover, the individual steps illustrated in FIG. 4 may include multiple sub-steps that may be performed in various sequences as appropriate to the individual step. For example, in step 404, the first pattern region may include multiple device features that may be defined in various sequences within the scope of the present invention. Furthermore, additional processing steps may be added or removed depending on the particular applications. One of ordinary skill in the art would recognize many variations, modifications, and alternatives.

Figure 5:
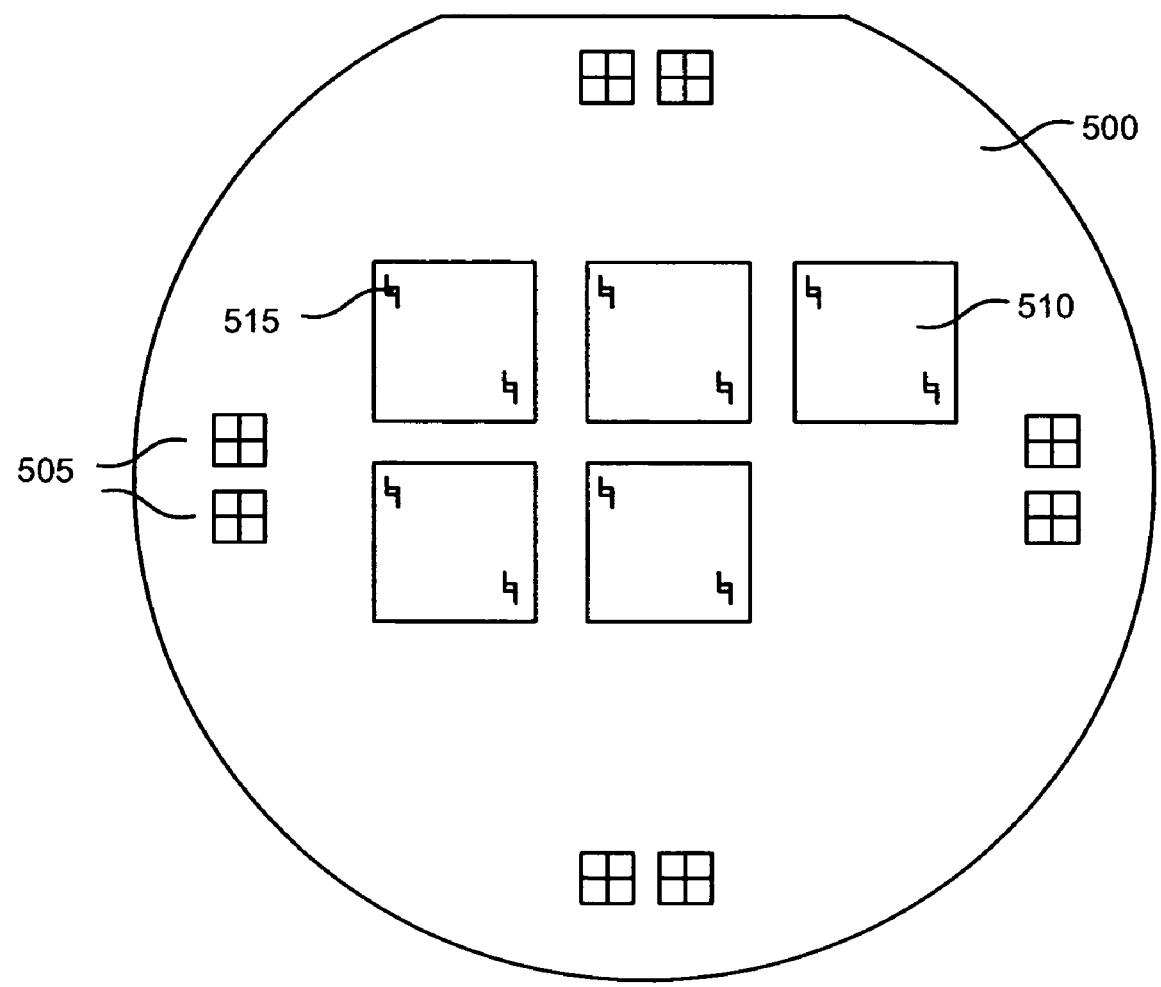
FIG. 5 is a simplified schematic illustration of a substrate with alignment marks according to an embodiment of the present invention.

FIG. 5 is a simplified schematic illustration of a substrate with alignment marks according to an embodiment of the present invention. As illustrated in FIG. 5, substrate 500 has several sets of alignment marks present on the surface of the substrate. A first set of alignment marks 505, represented by crosses inside squares, are present at peripheral edges of the substrate. For alignment marks 505, the squares can be a first level alignment mark and the crosses a second level alignment mark. In other embodiments, the alignment marks are reversed, with the crosses being a first level alignment mark and the squares a second level alignment mark.

In one embodiment, alignment marks 505 are referred to as global alignment marks, since they provide positioning with respect to the entire wafer. In a specific embodiment, alignment marks 505 are utilized by the first photolithographic stepper to align the substrate during photolithographic exposure. Although the alignment marks 505 are represented by crosses inside squares, this is not required by the present invention. Other embodiments utilize alignment marks of different geometries. Additionally, although alignment marks 505 are illustrated as distributed at four locations at peripheral edges of the substrate, this is not required by the present invention. Alternative embodiments utilize global alignment marks positioned at other locations, including interior portions of the substrate. One of ordinary skill in the art would recognize many variations, modifications, and alternatives.

Also illustrated in FIG. 5 are alignment marks 515 located on dies 510. As illustrated, each die 510 has at least one alignment mark 515 associated with the die. In one embodiment, the alignment marks are interlocking L-shaped marks. In a specific embodiment, the first level mark is an upright L-shaped mark and the second level mark is another L-shaped mark that has been rotated 180°. Interlocking features are provided on the marks for alignment purposes. However, the use of this particular set of alignment marks is not required by the present invention. In alternative embodiments, alignment marks of different geometries are utilized. Moreover, although FIG. 5 illustrates alignment marks 515 positioned at two corners of dies 510, this is not required by the present invention. Alignment marks 515, referred to as local alignment marks in one embodiment, may be placed at other corners of the dies or at interior positions of the dies.

In one embodiment of the present invention, global alignment marks are utilized by the first photolithographic stepper and local alignment marks are utilized by the second photolithographic stepper. For example, global alignment marks are used by a first stepper manufactured by ASML and local alignment marks are used by a second stepper manufactured by Canon in a particular embodiment. In order to process a substrate through a number of steps using the second stepper, followed by a number of steps using the first stepper, the second stepper is used to expose global alignment marks on the substrate that are then used by the first stepper in subsequent processing steps.

Figure 6:
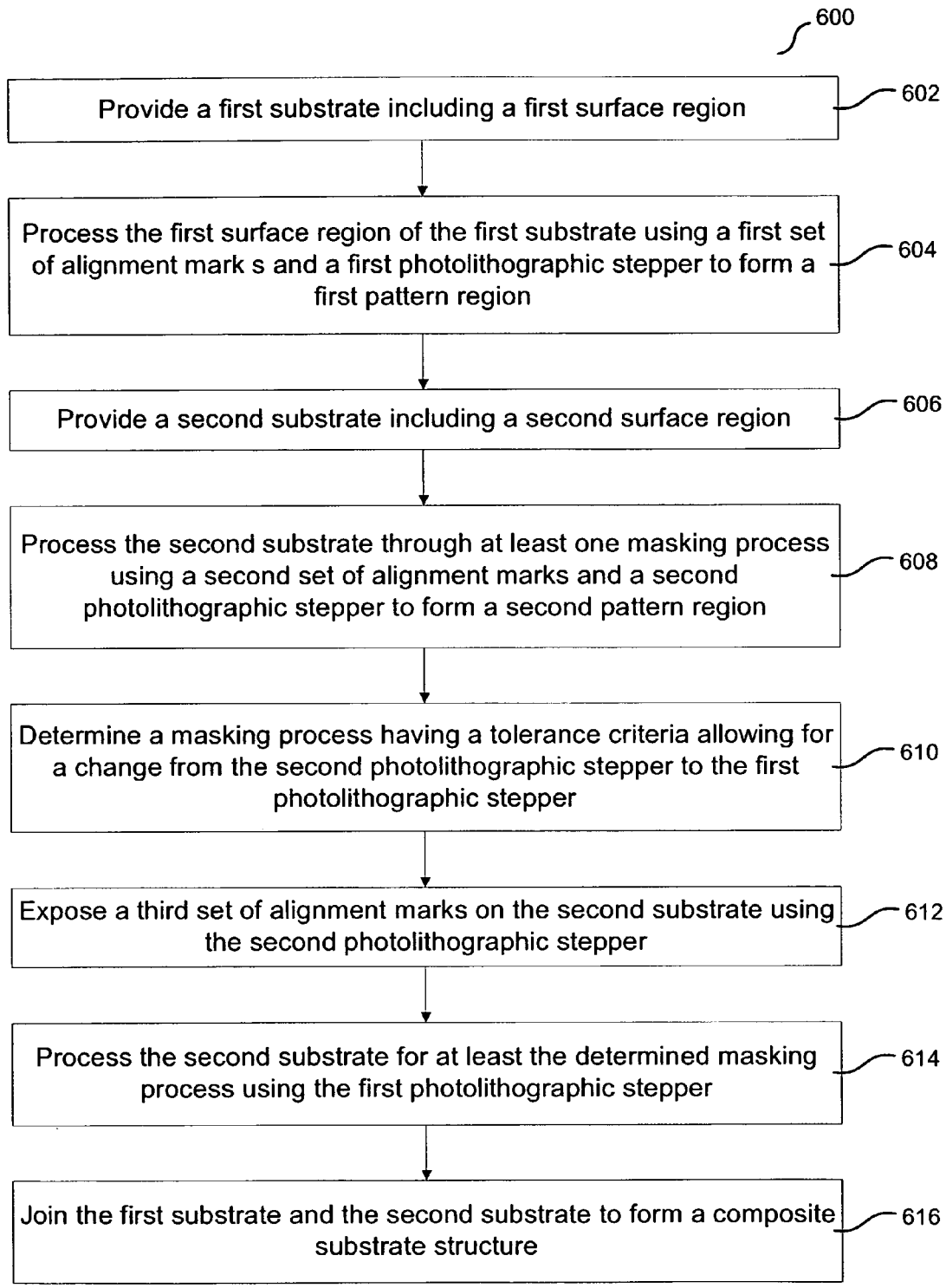
FIG. 6 is a simplified flow chart of an alternative substrate bonding process according to an embodiment of the present invention.

FIG. 6 is a simplified flow chart of an alternative substrate bonding process 600 according to an embodiment of the present invention. In step 602, a first substrate is provided including a first surface region. In one embodiment, the first substrate is a silicon substrate, but this is not required by the present invention. The first surface region of the first substrate is processed (604) using a first set of alignment marks and a first photolithographic stepper to form a first pattern region, for example, an array of recessed cavities suitable for the subsequent formation of an array of micro-mirrors. In one embodiment, the first pattern region includes a first set of bonding alignment marks defined using the first photolithographic stepper. In some embodiments, the first photolithographic stepper utilizes a step and repeat process to expose die patterns over an extended area of the first substrate. Moreover, in one specific embodiment, the first photolithographic stepper utilizes global alignment marks for aligning the dies during the step and repeat process. In one embodiment, the first stepper is characterized by an optical resolution and one or more alignment errors, including, but not limited to, translation, rotation, and distortion. In a particular embodiment according to the present invention, the first photolithographic stepper has a resolution of about 0.18 µm.

In step 606, a second substrate is provided including a second surface region. The second substrate is processed in step 608 through at least one masking process using a second set of alignment marks and a second photolithographic stepper to form a second pattern region. In a particular embodiment, the second set of alignment marks are local alignment marks associated with dies present on the second surface region, but this is not required by the present invention. Moreover, in a specific embodiment, the second substrate is processed to form at least a portion of the control circuitry and an array of electrodes coupled to the control circuitry. In step 610, a determination is made of a masking process having a tolerance criteria allowing for a change from the second photolithographic stepper to the first photolithographic stepper. In some embodiments, this masking process is a process to be performed on the second substrate and a tolerance criteria allowing for a change in steppers is an alignment tolerance for a particular structural feature to be fabricated on the second substrate, but this is not required by the present invention. In other embodiments, the tolerance criteria is an alignment tolerance for layer to layer alignment on a particular substrate. Although step 610 is illustrated as following step 608 in FIG. 6, this is not required according to certain embodiments of the present invention. Step 610 may be performed prior to other previous steps as illustrated in FIG. 6 as appropriate to the particular application. One of ordinary skill in the art would recognize many variations, modifications, and alternatives.

In step 612, the second photolithographic stepper is used to expose a third set of alignment marks on the second substrate. In a particular embodiment, the third set of alignment marks are global alignment marks suitable for use by the first photolithographic stepper. For example, the third set of alignment marks can be identical to the first set of alignment marks, but this is not required by the present invention. The second substrate is processed in step 614 for at least the determined masking process using the first photolithographic stepper. In one embodiment, the determined masking process defines a number of device features, including a second set of bonding alignment marks. In other embodiments, additional masking steps are performed on the second substrate using the first photolithographic stepper. The first and second substrates are joined in step 616 to form a composite substrate structure. Because the first and second set of bonding alignment marks are defined using the same photolithographic stepper in this embodiment of the present invention, the impact of stepper mismatch is reduced. Although the processing steps discussed above are described in a particular sequential order, this is not required according to certain embodiments of the present invention. For example, the additional masking steps may be performed prior to the definition of the second set of bonding alignment marks as appropriate to the particular application.

It should be appreciated that although the specific steps illustrated in FIG. 6 provide a particular process flow according to one embodiment of the present invention, the particular order of steps illustrated is not required. Alternative embodiments of the present invention perform the processing steps outlined above in different orders. For example, the order in which the substrates are processed may be varied, with the second substrate being processed prior to the first substrate. Moreover, the individual steps illustrated in FIG. 6 may include multiple sub-steps that may be performed in various sequences as appropriate to the individual step. For example, in step 604, the first pattern region may include multiple device features that may be defined in various sequences within the scope of the present invention. Furthermore, additional processing steps may be added or removed depending on the particular applications.

Referring back to FIG. 2, substrates 105 and 107 can be used to illustrate an example of one method of manufacturing bonded substrates using multiple photolithography tools according to a specific embodiment of the present invention. Substrate 105 is a silicon substrate that is processed using a first photolithographic stepper. In one embodiment, the first photolithographic stepper is an ASML stepper that utilizes global alignment marks (not shown) located on the surface of substrate 105. Substrate 105 is processed to form a first pattern region, including, in one embodiment, a number of cavities 220 suitable for the formation of an array of micro-mirrors. A first set of bonding alignment marks 216 are defined on substrate 105 along with cavities 220. In one embodiment, the bonding alignment marks are defined during the same masking step used to define the cavities 220, but this is not required by the present invention, as these structures may be defined in a different sequence in other embodiments.

Furthermore in this specific embodiment, substrate 107 is a silicon substrate with CMOS circuitry formed thereon. The second substrate 107 is initially processed using a second photolithographic stepper. In one embodiment, the second photolithographic stepper is a Canon stepper that utilizes local alignment marks located on the surface of substrate 107, but this is not required by the present invention. The second substrate is processed through at least one masking process, for example, exposure of elements that make up portions of the CMOS control circuitry, using the second photolithographic stepper. As illustrated in FIG. 2, in this specific embodiment, the substrate 107 is processed through multiple masking steps, including the definition of metal layers 222, 224, and 226 utilizing the second photolithographic stepper. Additionally, via layers 232, 234, and 236 are defined using the second photolithographic stepper. In performing these masking steps, local alignment marks are used to align the dies before exposure. After the via layer 236 is defined, the second photolithographic stepper is used to define global alignment marks (not shown) on substrate 107.

It should be appreciated that although the specific steps outlined above are discussed in relation to a particular process flow, this is not required according to certain embodiments of the present invention. Alternative embodiments of the present invention perform the processing steps outlined above in different orders. Furthermore, additional processing steps may be added or removed depending on the particular applications. For example, the order in which alignment marks are formed is varied in some embodiments. Additionally, alignment marks present either on the first or second substrates may be used during multiple masking steps.

In the specific embodiment illustrated in FIG. 2, the tolerance for alignment between various layers of the structures fabricated on substrate 107 ranges over a predetermined range. Although the second photolithographic stepper used to pattern the initial series of masking layers on substrate 107 may have an alignment tolerance of 0.35 μm, the alignment tolerances between layers of the structure may have reduced tolerance criteria, for example, a tolerance of greater than 0.35 μm. Moreover, although the stepper mismatch between two different steppers may have a non-zero value, this stepper mismatch value may be less than the tolerance criteria between layers. For example, in this specific embodiment, the tolerance for the alignment of metal 4 to via 3 is approximately 1.0 μm. Thus, a determination is made that the masking process from via 3 to metal 4 has a tolerance criteria that allows for a change from the second photolithographic stepper to the first photolithographic stepper. Merely by way of example, an alignment tolerance of 0.35 μm for the second stepper and a stepper mismatch between steppers of 0.3 μm, sum to a value less than the 1.0 μm alignment tolerance characteristic of the via 3 to metal 4 masking step. Thus, referring to FIG. 2, after the determination is made that the masking process for metal 4 has a tolerance criteria allowing for a change from the second photolithographic stepper to the first photolithographic stepper, the second stepper is used to define the via 3 masking layer and then define global alignment marks (not shown) on substrate 107.

Utilizing the global alignment marks exposed using the second photolithographic stepper, the first photolithographic stepper is then utilized to expose the metal 4 masking layer and a second set of bonding alignment marks 212 on substrate 107. In alternative embodiments, masking steps following the metal 4 masking step are performed utilizing the first photolithographic stepper. In a particular embodiment, the final masking step for substrate 107 is performed utilizing the first photolithographic stepper. Thus, in some embodiments, because the first photolithographic stepper is used to expose the structures formed on substrate 105, as well as the final masking step on substrate 107, there is no stepper mismatch between the substrates with they are bonded together. After the completion of the photolithography processes and subsequent processing steps, the first and second substrates are joined to form a composite substrate structure. Alignment and bonding of the substrates is performed as described above.

Figure 7A:
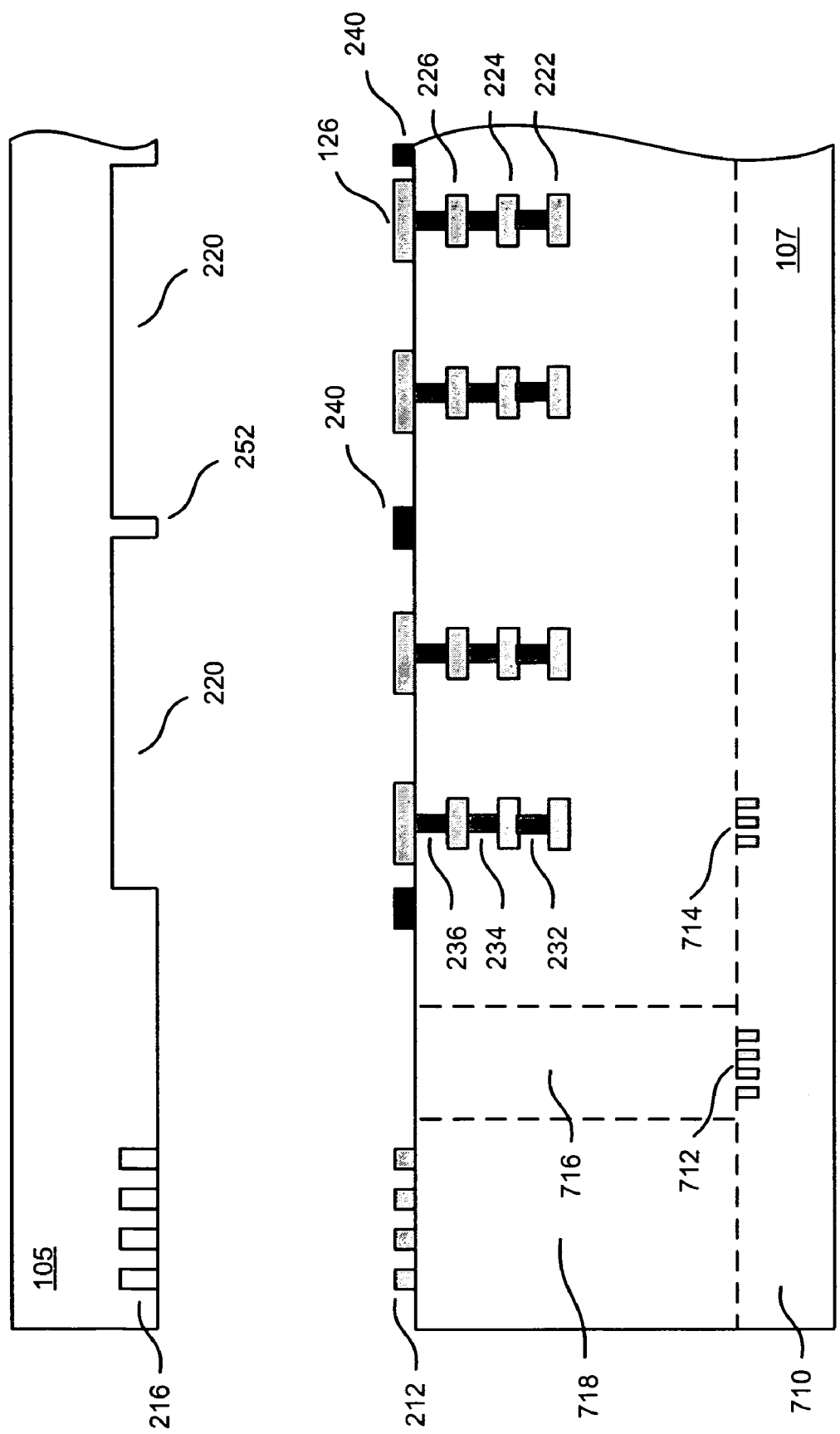
FIG. 7A is a simplified schematic illustration of two substrates prior to a wafer bonding process according to an alternative embodiment of the present invention.

FIG. 7A is a simplified schematic illustration of two substrates prior to a wafer bonding process according to an alternative embodiment of the present invention. Substrate 105 is processed as described above to form structures 220 along with other device features. A first photolithographic stepper characterized by a first tolerance for alignment is used in the masking processes performed on substrate 105. In addition, a first set of bonding alignment marks 216 are defined on the first surface region of the first substrate using the first photolithographic stepper.

As illustrated in FIG. 7A, region 710 represents the surface of the silicon substrate prior to any processing directed toward fabricating the layer of electrodes (see layer 104 in FIG. 1A) and the layer of control circuitry (see layer 106 in FIG. 1A). Before these fabrication processes are started, in one embodiment of the present invention, alignment marks 712 and 714 are defined on the surface of substrate 107. In a specific embodiment, the first alignment marks 712 defined on the substrate are global alignment marks, which are defined using the first stepper, for example, an ASML stepper. Next, a second set of alignment marks 714 are defined using a second stepper, for example a Canon stepper, and are referenced to the global alignment marks 712. In one embodiment, the global alignment marks 712 are defined such that they are usable by both the first and second steppers.

Substrate 107 is processed through multiple masking steps utilizing the second photolithographic stepper, including the definition of metal layers 222, 224, and 226. During these masking steps, additional alignment marks at each masking layer (not shown), which are referenced to the local alignment marks 714, are typically utilized. As described previously, via layers 232, 234, and 236 are also defined using the second photolithographic stepper. As illustrated in FIG. 7A, a path 716 is located above the alignment marks 712 and bounded by dashed lines. This path is an optical path in one embodiment and is maintained substantially free of device features during the processing of substrate 107. The path 716 provides an optical imaging path between the first photolithographic stepper and the alignment marks 712 present on the second substrate. Thus, the first photolithographic stepper is able to image the alignment marks 712 during operation of the stepper. In some embodiments, maintaining path 716 substantially free of device features involves additional masking steps used to remove materials deposited in this region. Moreover, in alternative embodiments, the planarity of path 716 is maintained through the use of additional masking and processing steps as will be evident to one of skill in the art.

Region 718, illustrated in FIG. 7A is a path located below alignment marks 212 and is maintained substantially free of device features in another embodiment according to the present invention. As described more fully in co-pending and commonly assigned U.S. patent application Ser. No. 10/843, 793, filed on May 11, 2004, now U.S. Patent Publication No. 2005/0255666 A1, published on Nov. 17, 2005, and herein incorporated by reference in its entirety, alignment of substrates during a bonding process may employ an infrared radiation source to illuminate one or more of the substrates. For example, in one process, the lower surface of substrate 107, as illustrated in FIG. 7A is illuminated with an infrared source. The radiation propagates through region 718 and passes out through the upper surface of substrate 107, where a portion of the radiation is blocked by alignment marks 212. In this embodiment, maintaining region 718 substantially free of device features enhances the utility of alignment marks 212 in aligning substrates 105 and 107.

After the via layer 236 is defined, a determination is made that a masking process has a tolerance criteria that allows for a change from the second photolithographic stepper to the first photolithographic stepper. The first photolithographic stepper the utilizes alignment marks 712, which were defined by the first photolithographic stepper, to define the metal 4 layer 126 and bonding alignment marks 212 on the surface of substrate 107. In an embodiment of the present invention, the alignment tolerance for the placement of the second set of bonding alignment marks is less than or equal to 100 nm. In alternative embodiments, the alignment tolerances for the placement of the first and second set of bonding alignment marks are related. In a specific embodiment, the alignment marks 216 and 712 are defined using the same photolithographic stepper and may be identical marks. Since alignment marks 212 are referenced to alignment marks 712 and fabricated using the same photolithographic stepper in one embodiment, the alignment tolerance for the placement of alignment marks 212 with respect to alignment marks 712 is less than or equal to 100 nm.

It should be appreciated that the particular structures defined on the surfaces of the first and second substrates, along with the sequence in which the particular structures are defined are varied according to the needs of particular applications. For example, the first set of bonding alignment marks defined on the first surface region of the first substrate may be defined using the final mask layout used to define features on the first substrate. Alternatively, the first set of bonding alignment marks may be defined prior to the final mask process or as the final masking process. Similar alternative processing sequences are available with relation to the second substrate, as one skilled in the art will appreciate.

Figure 7B:
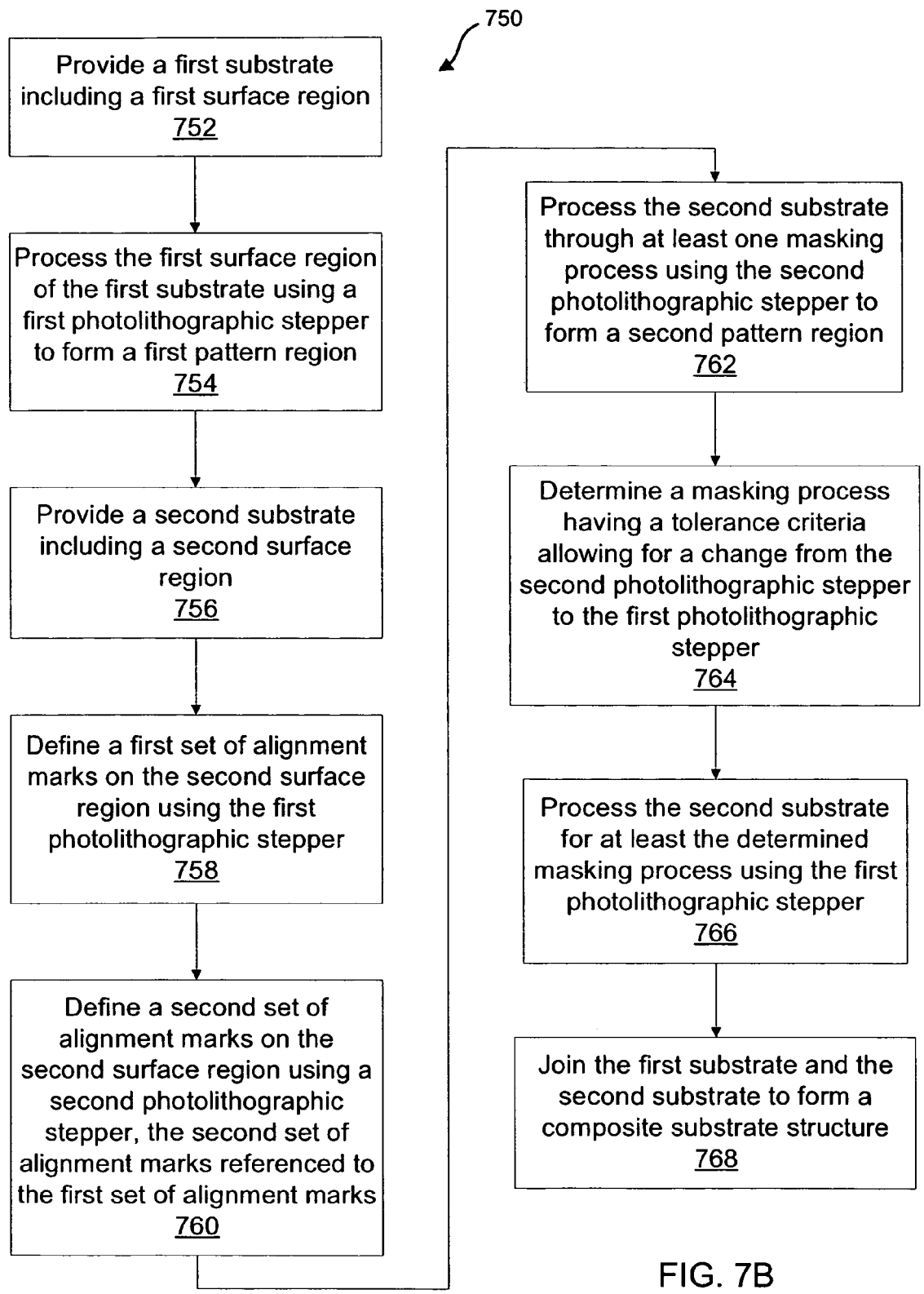
FIG. 7B is a simplified flow chart of a substrate bonding process according to an alternative embodiment of the present invention.

FIG. 7B is a simplified flow chart of a substrate bonding process according to an alternative embodiment of the present invention. The substrate bonding process 750 first provides a first substrate, the first substrate including a first surface region (step 752). In step 754, the first surface region is processed using a first photolithographic stepper to form a first pattern region on the first surface region. In a specific embodiment, the first pattern region includes wells or recessed regions suitable for the subsequent manufacturing of micro-mirror arrays along with a first set of bonding alignment marks. In a particular embodiment, the first substrate is a silicon substrate. A second substrate is provided in step 756, the second substrate including a second surface region. The second substrate is a silicon wafer in one embodiment of the present invention. The first photolithographic stepper is used in step 758 to define a first set of alignment marks on the second surface region. In one embodiment, the first set of alignment marks are global alignment marks. In step 760, a second photolithographic stepper is used to define a second set of alignment marks on the second surface region. The second set of alignment marks are referenced to the first set of alignment marks. In a specific embodiment, the second set of alignment marks are local alignment marks.

The second substrate is processed through at least one masking process using the second photolithographic stepper to form a second pattern region in step 762. The second set of alignment marks are used by the second photolithographic stepper in aligning the next masking process performed on the second surface region. Additional alignment marks defined by the second photolithographic stepper are used in alternative embodiments as additional masking processes are performed on the second surface region. In yet another embodiment, alignment marks defined using the second photolithographic stepper are utilized during multiple masking steps performed on the second substrate. In step 764, a determination is made that a masking process has a tolerance criteria allowing for a change from the second photolithographic stepper to the first photolithographic stepper. In a specific embodiment, the tolerance criteria is an alignment tolerance between a selected masking process and a subsequent masking process. The second substrate is then processed through at least one masking process using the first photolithographic stepper in step 766.

In a particular embodiment of the present invention, the first photolithographic stepper utilizes the first set of alignment marks defined in step 758 in performing the masking process in step 766. As described above, a region located above the alignment marks defined in step 758 is maintained substantially free of device features during the processing of the second substrate. Thus, the alignment marks defined in step 758 are visible for use by the first photolithographic stepper in step 766. In one embodiment, the masking process performed in step 766 is the last masking process performed on the second surface region. In this embodiment, the masking process in step 766 defines the final device features on the second substrate along with a second set of bonding alignment marks on the second surface region. The first substrate and the second substrate are joined in step 768 to form a composite substrate structure. The first and second set bonding alignment marks, defined using the first photolithographic stepper on both the first substrate and the second substrate, respectively, are used in the joining process. The use of a single photolithographic stepper to define both sets of bonding alignment marks reduces stepper mismatch.

It will be apparent to one of skill in the art that the sequential order of processing steps discussed in relation to FIGS. 7A and 7B may be varied within the scope of the present invention. For example, the order in which the substrates are processed may be varied, with the second substrate being processed prior to the first substrate. Additionally, the individual steps may have multiple sub-steps that may be performed in various orders, for instance, in step 754, the first pattern region may contain various device structures that are defined in various orders. Merely as an example, the first set of bonding alignment marks may be defined using the first photolithographic stepper prior to, simultaneously with, or subsequent to the definition of other device structures formed on the first surface region of the first substrate in step 754. Moreover, the definition of the second set of bonding alignment marks using the first photolithographic stepper may be performed prior to, simultaneously with, or subsequent to the definition of the final device structures formed on the second surface region of the second substrate in step 766. Furthermore, step 764, which comprises determining a masking process having a tolerance criteria allowing for a change of steppers may be performed prior to the previous processing steps as illustrated in FIG. 7B. As it should be appreciated, additional processing steps may be added or removed depending on the particular applications.

Figure 8A:
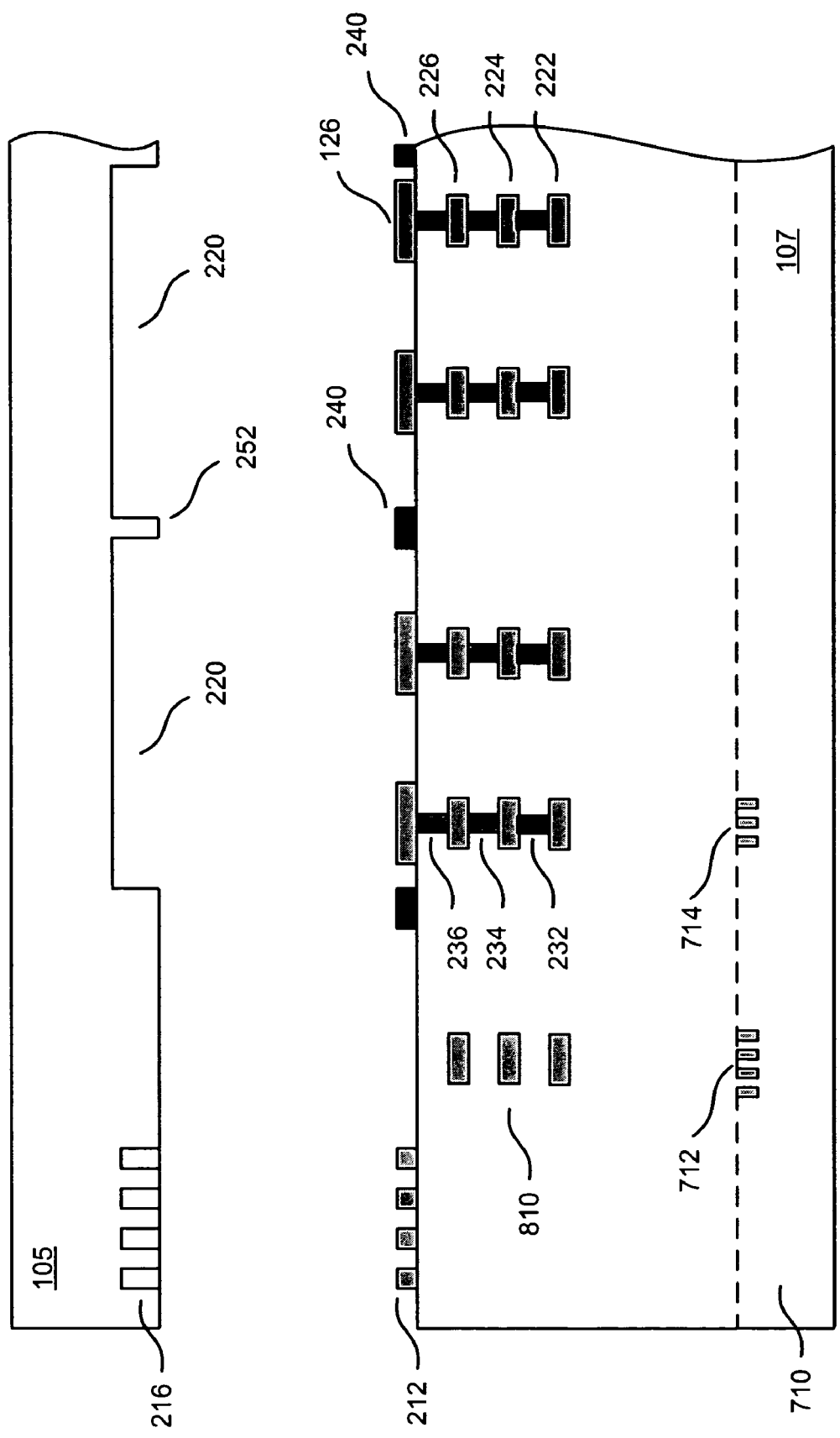
FIG. 8A is a simplified schematic illustration of two substrates prior to a wafer bonding process according to yet another alternative embodiment of the present invention.

FIG. 8A is a simplified schematic illustration of two substrates prior to a wafer bonding process according to yet another alternative embodiment of the present invention. Substrate 105 is processed as previously discussed, with the first set of bonding alignment marks 216 defined using the first photolithographic stepper. As illustrated in FIG. 8A, region 710 represents the surface of the silicon substrate prior to any processing directed toward fabricating the layer of electrodes (see layer 104 in FIG. 1A) and the layer of control circuitry (see layer 106 in FIG. 1A). Before these fabrication processes are started, in one embodiment of the present invention, alignment marks 712 and 714 are defined on the surface of substrate 107. In a specific embodiment, the first alignment marks 712 defined on the substrate are global alignment marks, which are defined using the first stepper, for example, an ASML stepper. Next, a second set of alignment marks 714 are defined using a second stepper, for example a Canon stepper, and are referenced to the global alignment marks 712. In one embodiment, the global alignment marks 712 are defined such that they are usable by both the first and second steppers.

Substrate 107 is processed through multiple masking steps utilizing the second photolithographic stepper, including the definition of metal layers 222, 224, and 226. During these masking steps, additional alignment marks (not shown), which are referenced to the local alignment marks 714 are utilized. In some embodiments, these additional alignment marks are present at each masking layer, whereas in other embodiments, these additional alignment marks are present at selected masking layers. As described previously, via layers 232, 234, and 236 are also defined using the second photolithographic stepper. As illustrated in FIG. 8A, device features 810 are fabricated during the processing steps and are located above the alignment marks 712.

As illustrated in FIG. 8A, the metal 4 layer 126 and the second set of bonding alignment marks 212 are defined using the second photolithographic stepper. The definition of the metal 4 layer 126 and the bonding alignment marks may be performed simultaneously using the same mask layout or sequentially, as the application requires. As described above, the second set of alignment marks 714 are referenced to alignment marks 712, defined by the first photolithographic stepper. Thus, the first photolithographic stepper is used to define an alignment grid to which the second set of alignment marks are referenced. The second photolithographic stepper utilizes alignment marks 714, along with additional alignment marks (not shown) referenced to alignment marks 714, during the masking processes performed on substrate 107. Because the second set of alignment marks are referenced to the first set of alignment marks, defined using the first photolithographic stepper, the stepper mismatch is reduced.

Figure 8B:
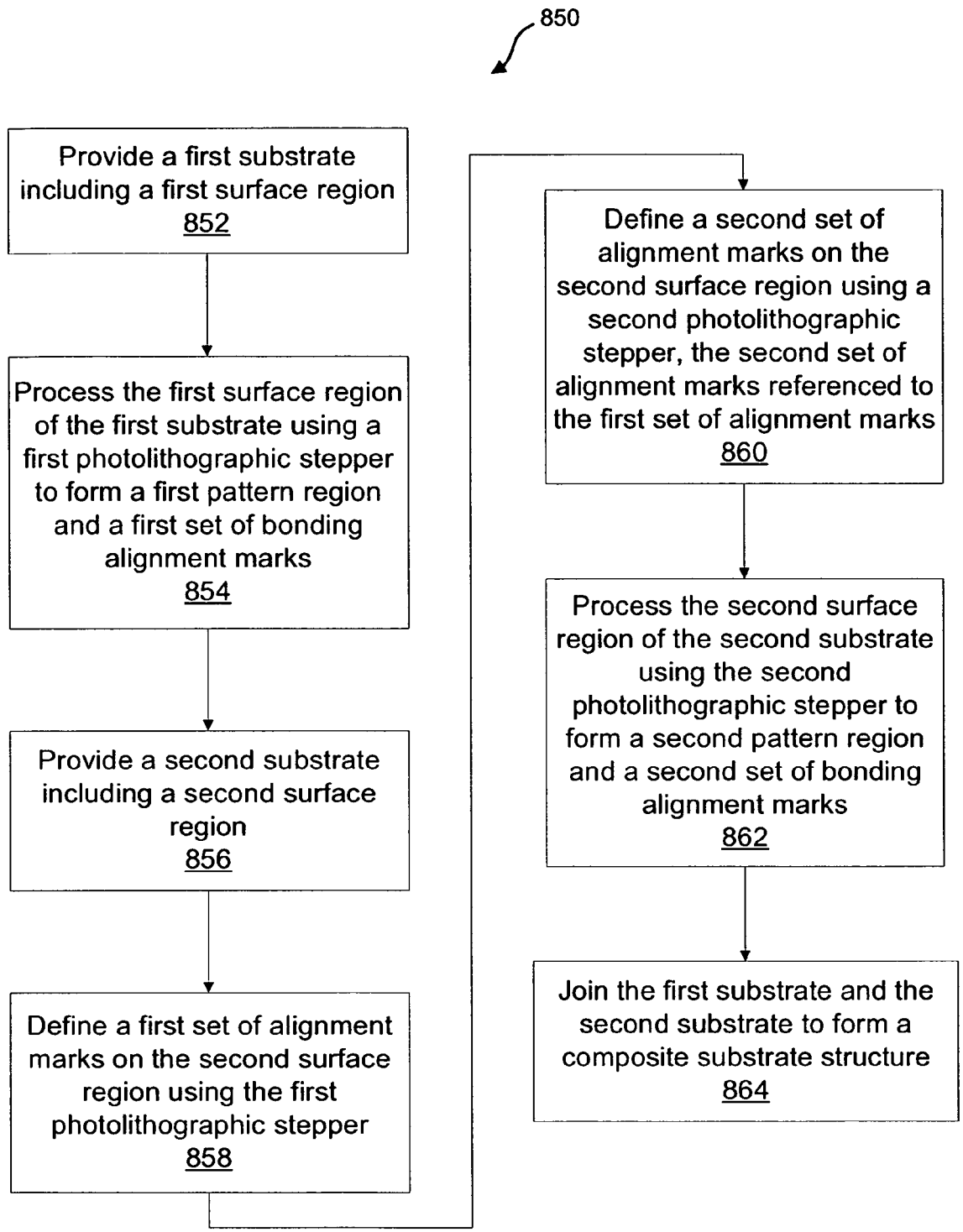
FIG. 8B is a simplified flow chart of a substrate bonding process according to yet another alternative embodiment of the present invention.

FIG. 8B is a simplified flow chart of a substrate bonding process according to yet another alternative embodiment of the present invention. The substrate bonding process 850 first provides a first substrate, the first substrate including a first surface region (step 852). In step 854, the first surface region is processed using a first photolithographic stepper to form a first pattern region on the first surface region and a first set of bonding alignment marks. In a specific embodiment, the first pattern region includes wells or recessed regions suitable for the subsequent manufacturing of micro-mirror arrays. In a particular embodiment, the first substrate is a silicon substrate. A second substrate is provided in step 856, the second substrate including a second surface region. The second substrate is a silicon wafer in one embodiment of the present invention. The first photolithographic stepper is used in step 858 to define a first set of alignment marks on the second surface region. In one embodiment, the first set of alignment marks are global alignment marks. In step 860, a second photolithographic stepper is used to define a second set of alignment marks on the second surface region. The second set of alignment marks are referenced to the first set of alignment marks. In a specific embodiment, the second set of alignment marks are local alignment marks.

The second surface region of the second substrate is processed using the second photolithographic stepper to form a second pattern region and a second set of bonding alignment marks in step 862. The second set of alignment marks are used by the second photolithographic stepper in aligning the next masking process performed on the second surface region. Additional alignment marks defined using the second photolithographic stepper are used in alternative embodiments as additional masking processes are performed on the second surface region.

The first substrate and the second substrate are joined in step 864 to form a composite substrate structure. The first set of bonding alignment marks, defined using the first photolithographic stepper on the first substrate and the second set of bonding alignment marks, defined using the second photolithographic stepper on the second substrate, are used in the joining process. As described, the second set of bonding alignment marks on the second substrate are referenced to the second set of alignment marks, which are defined using the second photolithographic stepper. The second set of alignment marks are referenced to the first set of alignment marks, defined using the first photolithographic stepper. Thus, both sets of bonding alignment marks are fundamentally referenced to the first photolithographic stepper, thereby reducing the stepper mismatch.

Although the steps described in FIG. 8B are arranged in a particular order, this particular order is not required according to certain embodiments of the present invention. For example, the order in which the substrates are processed may be varied, with the second substrate being processed prior to the first substrate. Moreover, the individual steps may have multiple sub-steps that may be performed in various orders as appropriate to the particular step.

While the above is a complete description of specific embodiments of the invention, the above description should not be taken as limiting the scope of the invention as defined by the claims.

What is claimed is:

1. A method of manufacturing bonded substrate structures, the method comprising:
    providing a first substrate comprising a first surface region;
    processing the first surface region of the first substrate to form a first pattern region and a first set of alignment marks using a first photolithographic stepper characterized by a first tolerance criteria for alignment;
    providing a second substrate comprising a second surface region;
    forming a second set of alignment marks on the second surface region using the first photolithographic stepper and a third set of alignment marks on the second surface region using a second photolithographic stepper;
    processing the second surface region of the second substrate through at least one masking process, using the third set of alignment marks, to form a second pattern region using a second photolithographic stepper characterized by a second tolerance criteria for alignment;
    determining a masking process having a third tolerance criteria for alignment, the third tolerance criteria allowing for a change from the second photographic stepper to the first photographic stepper;
    processing the second substrate for at least the determined masking process and producing a third pattern region and a fourth set of alignment marks using the first photolithographic stepper, the fourth set of alignment marks being referenced to the second set of alignment marks; and
    joining the first substrate to the second substrate to form a composite substrate structure with alignment of the substrates determined by registration of at least a portion of the first set of alignment marks on the first substrate with at least a portion of the fourth set of bonding alignment marks on the second substrate.

2. The method of claim 1 wherein the third tolerance criteria for alignment is a linear distance.

3. The method of claim 2 wherein the third tolerance criteria for alignment provides a process window larger than the first and second tolerance criteria for alignment.

4. The method of claim 3 wherein the determined masking process is a process of exposing a pattern for an electrode.

5. The method of claim 1 wherein the first surface region of the first substrate comprises a plurality of recessed regions.

6. The method of claim 1 further comprising, prior to the step of processing the second substrate using the first photolithographic stepper, using the second photolithographic stepper to expose a plurality of alignment marks on the second substrate, the plurality of alignment marks being usable by the first photolithographic stepper.

7. A method of manufacturing bonded substrate structures, the method comprising:
provi ding a first substrate comprising a first surface region;
using a first set of alignment marks to process the first surface region of the first substrate to form a first pattern region and a first set of alignment marks, utilizing a first photolithographic stepper characterized by a first tolerance criteria for alignment;
providing a second substrate comprising a second surface region;
using a second set of alignment marks to process the second surface region of the second substrate through at least one masking process to form a second pattern region using a second photolithographic stepper characterized by a second tolerance criteria for alignment;
determining a masking process having a third tolerance criteria for alignment, the third tolerance criteria allowing for a change from the second photographic stepper to the first photographic stepper;
forming a third set of alignment marks on the second substrate using the second photolithographic stepper;
processing the second substrate for at least the determined masking process and producing a third pattern region and a fourth set of alignment marks, using the first photolithographic stepper; and
joining the first substrate to the second substrate to form a composite substrate structure with alignment of the substrates determined by registration of the first set of alignment marks on the first substrate with at least a portion of the fourth set of alignment marks on the second substrate.

8. The method of claim 7 wherein the first set of alignment marks are local alignment marks and the second set of alignment marks are global alignment marks.

9. The method of claim 7 wherein the third set of alignment marks are local alignment marks.

10. The method of claim 9 wherein the first set of alignment marks and the third set of alignment marks are identical.

11. The method of claim 7 wherein the third tolerance criteria for alignment has a value that is greater than a stepper mismatch between the first photolithographic stepper and the second photolithographic stepper.

12. The method of claim 11 wherein the third tolerance criteria is an alignment tolerance between a selected masking process and a subsequent masking process.

13. The method of claim 12 wherein the selected masking process is a step of exposing a via 3 layer and the subsequent masking process is a step of exposing a metal 4 layer.

14. A method of manufacturing bonded substrate structures, the method comprising:
providing a first substrate comprising a first surface region;
processing the first surface region of the first substrate to form a first pattern region and a first set of alignment marks using a first photolithographic stepper characterized by a first tolerance criteria for alignment;
providing a second substrate comprising a second surface region;
defining a second set of alignment marks on the second surface region using the first photolithographic stepper;
defining a third set of alignment marks on the second surface region using a second photolithographic stepper characterized by a second tolerance criteria for alignment, wherein the third set of alignment marks are referenced to the second set of alignment marks;
processing the second surface region of the second substrate through at least one masking process to form a second pattern region using the second photolithographic stepper;
determining a masking process having a third tolerance criteria for alignment, the third tolerance criteria allowing for a change from the second photolithographic stepper to the first photolithographic stepper;
processing the second substrate through at least the determined masking process producing a third pattern region and a fourth set of alignment marks using the first photolithographic stepper; and
joining the first substrate to the second substrate to form a composite substrate structure with alignment of the substrates determined by registration of at least a portion of the first set of alignment marks on the first substrate with at least a portion of the fourth set of alignment marks on the second substrate.

15. The method of claim 14 wherein the second set of alignment marks are global alignment marks.

16. The method of claim 14 wherein the third set of alignment marks are local alignment marks.

17. The method of claim 14 further comprising forming a path on a portion of the second surface region such that the first photolithographic stepper uses the second set of alignment marks during the step of processing the second substrate through at least the determined masking process.

18. The method of claim 17 wherein the path is an optical path maintained substantially free of device features.

* * * * *